(12) United States Patent
Zhou

(10) Patent No.: US 11,476,107 B2
(45) Date of Patent: Oct. 18, 2022

(54) CLEANING FLUID GUIDE DEVICE FOR WET CLEANING EQUIPMENT

(71) Applicant: Shanghai Huali Integrated Circuit Corporation, Shanghai (CN)

(72) Inventor: Jiangang Zhou, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 158 days.

(21) Appl. No.: 17/164,923

(22) Filed: Feb. 2, 2021

(65) Prior Publication Data

US 2022/0093389 A1 Mar. 24, 2022

(30) Foreign Application Priority Data

Sep. 24, 2020 (CN) .......................... 202011015020.8

(51) Int. Cl.
*H01L 21/02* (2006.01)
*B08B 3/10* (2006.01)
*B08B 3/02* (2006.01)
*H01L 21/67* (2006.01)

(52) U.S. Cl.
CPC .......... *H01L 21/02052* (2013.01); *B08B 3/02* (2013.01); *B08B 3/10* (2013.01); *H01L 21/6715* (2013.01)

(58) Field of Classification Search
CPC .................................................. H01L 21/02052
See application file for complete search history.

(56) References Cited

U.S. PATENT DOCUMENTS

2009/0121156 A1\* 5/2009 Mahoney .......... H01L 21/02052
250/492.2

\* cited by examiner

*Primary Examiner* — Jason Y Ko
(74) *Attorney, Agent, or Firm* — Banner & Witcoff, Ltd.

(57) ABSTRACT

The present application relates to semiconductor integrated circuit manufacturing equipment, in particular to a cleaning fluid guide device for wet cleaning equipment, wherein a positive voltage end and a negative voltage end are provided on both ends of a nozzle to apply an electric field to a cleaning fluid sprayed by the nozzle, and the electric field guides the cleaning fluid to form an included angle θ between the cleaning fluid and a wafer backside, such that spraying of the cleaning fluid does not always start from the center of the wafer backside, avoiding the problem that the center of the wafer backside is relatively thin while the edge thereof is relatively thick after a plurality of repeated wet cleaning processes, and thereby improving the yield of semiconductor devices.

13 Claims, 4 Drawing Sheets

CLEANING FLUID GUIDE DEVICE FOR WET CLEANING EQUIPMENT

CROSS-REFERENCE TO RELATED APPLICATIONS

This application claims priority to Chinese patent application No. 202011015020.8, filed on Sep. 24, 2020, and entitled "Cleaning Fluid Guide Device for Wet Cleaning Equipment", the disclosure of which is incorporated herein by reference in its entirety.

TECHNICAL FIELD

The present application relates to the field of semiconductor integrated circuit manufacturing equipment, in particular to a cleaning fluid guide device for wet cleaning equipment.

BACKGROUND

In the manufacturing process of semiconductor integrated circuits, the wafer backside is often contaminated by particles or metal ions. For example, during a back-end process, the wafer backside is often contaminated by metal ions, and wafer backside cleaning thus is required to remove the metal ions. Currently, wet cleaning is often adopted to remove the contamination.

FIG. 1 is a schematic diagram of a device for cleaning a wafer backside by means of a wet cleaning process according to an embodiment of the prior art. Referring to FIG. 1, the device includes a wafer 100, the wafer 100 is supported by a support portion 110, and a nozzle 120 sprays a cleaning fluid 130 to clean the wafer backside 101. The spraying of the cleaning fluid 130, such as a mixture of HF and an oxidizing reagent (such as $HNO_3$, $H_2O_2$, etc.), usually starts from the center of the wafer backside 101. In the case of a plurality of repeated cleaning processes, for example, during a back-end metal interconnection process, each time before a photolithography process and an etching process are performed, the wafer backside cleaning needs to be performed to remove metal ions, and with the increase of the number of metal layers, the number of times of wafer backside cleaning also increases, if the spraying of the cleaning fluid 130 always starts from the center of the wafer backside 101 in each time of cleaning, the amount of etching in the center of the wafer backside 101 is large, leading to the problem that the center of the wafer backside 101 is relatively thin while the edge thereof is relatively thick, the uneven wafer backside is easy to cause an increase in semiconductor manufacturing process defects, thereby affecting the yield of semiconductor devices. Moreover, such the problem becomes more serious with the increase of the cleaning times.

FIG. 2 is a schematic diagram of a device for cleaning a wafer backside by means of a wet cleaning process according to another embodiment of the prior art. Referring to FIG. 2, in order to improve the problem, i.e., the spraying of the cleaning fluid 130 always starting from the center of the wafer backside 101, of the device shown in FIG. 1, a mechanical arm 140 capable of adjusting the position of the nozzle 120 is added, and the mechanical arm 140 is controlled by a transmission structure and a control structure (not shown in the figure) connected thereto, such that the mechanical arm 140 is located at different starting positions in different cleaning processes. That is, the current situation in which the spraying of the cleaning fluid 130 always starts from the center of the wafer backside 101 is improved to avoid the problem that the center of the wafer backside 101 is relatively thin while the edge thereof is relatively thick, such that the wafer backside is flat and the yield of semiconductor devices thus is improved. However, the implementation of the method requires continuous movements of the mechanical arm 140 and an auxiliary structure thereof to change the position of the nozzle 120; the mechanical movements may cause component wear that results in particle generation, leading to a defect of further contamination to the wafer; and the added auxiliary structure is not easy to be accurately controlled.

BRIEF SUMMARY OF THE DISCLOSURE

According to some embodiments in this application, a cleaning fluid guide device for wet cleaning equipment, including: a nozzle used to spray a cleaning fluid to clean a wafer backside, wherein the nozzle is located on the wafer backside of a wafer; and a positive voltage end and a negative voltage end, wherein the positive voltage end and the negative voltage end are located on the wafer backside and respectively located on both sides of the nozzle, and are used to apply an electric field to the cleaning fluid sprayed by the nozzle, so that an included angle between the cleaning fluid and the wafer backside is controllable when the nozzle starts to spray the cleaning fluid.

DETAILED DESCRIPTION OF THE DISCLOSURE

Figure 1:
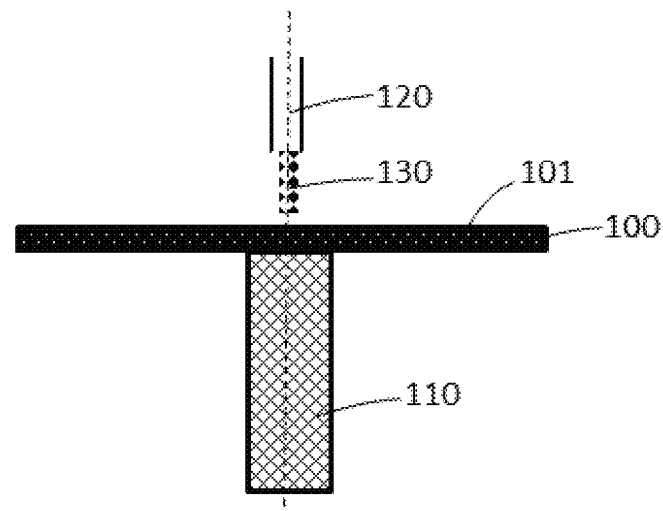
FIG. 1 is a schematic diagram of a device for cleaning a wafer backside by means of a wet cleaning process according to an embodiment of the prior art.
Figure 2:
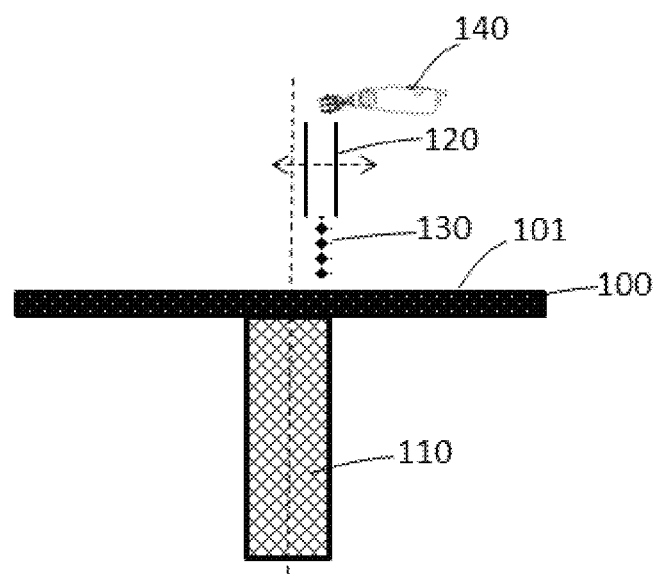
FIG. 2 is a schematic diagram of a device for cleaning a wafer backside by means of a wet cleaning process according to another embodiment of the prior art.

The technical solution of the present application will be clearly and completely described below with reference to the drawings. Obviously, the described embodiments are part of the embodiments of the present application, instead of all of them. Based on the embodiments in the present application, all other embodiments obtained by one skilled in the art without contributing any inventive labor shall fall into the protection scope of the present application.

It should be understood that the present application can be implemented in different forms and should not be construed as being limited to the embodiments provided herein. On the contrary, the provision of these embodiments will make the disclosure thorough and complete, and will fully convey the scope of the present application to those skilled in the art. In the drawings, the sizes and relative sizes of layers and regions may be exaggerated for clarity, and the same reference numeral represents the same element throughout. It should be understood that if an element or a layer is referred to as being "on", "adjacent to", "connected to", or "coupled to" another element or layer, it can be directly on the other element or layer, be adjacent thereto, be connected or coupled to the other element or layer, or there may be an intermediate element or layer. In contrast, if an element is referred to as being "directly on", "directly adjacent to", "directly connected to", or "directly coupled to" another element or layer, there is no intermediate element or layer. It should be understood that although the terms first, second, third, etc. may be used to describe various elements, components, regions, layers, and/or portions, these elements, components, regions, layers, and/or portions should not be limited by these terms. These terms are only used to distinguish one element, component, region, layer, or portion from another element, component, region, layer, or portion. Therefore, without departing from the teaching of the present application, the first element, component, region, layer, or portion discussed below may be referred to as a second element, component, region, layer, or portion.

Spatial relationship terms, such as "under", "below", "lower", "beneath", "over", and "upper", etc., can be used herein for convenience of description, so as to describe the relationship between one element or feature shown in the drawing and other element or feature. It should be understood that, in addition to the orientation shown in the drawing, the spatial relationship terms are intended to further include different orientations of a device in use and operation. For example, if the device in the drawing is turned over, then elements or features described as "below other element" or "under other element" or "beneath other element" will be oriented "above" the other element or feature. Therefore, the exemplary terms "below" and "under" may include both upper and lower orientations. The device can be oriented in other direction (rotated by 90 degrees or in other orientation) and spatial terms used herein are interpreted accordingly.

The terms used herein are only intended for describing the specific embodiments, instead of limiting the present application. When used herein, the singular forms "a", "one", and "the/said" are also intended to include plural forms, unless otherwise indicated in the context clearly. It should also be understood that the terms "consisting of" and/or "including", when used in the Description, determine the existence of the described features, integers, steps, operations, elements, and/or components, but do not exclude the existence or addition of one or more other features, integers, steps, operations, elements, components, and/or groups. When used herein, the term "and/or" includes any and all combinations of related items listed.

In an embodiment of the present application, a cleaning fluid guide device for wet cleaning equipment is provided. For details, please refer to FIG. 3, which is a schematic diagram of the cleaning fluid guide device for wet cleaning equipment according to an embodiment of the present disclosure. The cleaning fluid guide device for wet cleaning equipment in this embodiment of the present application includes: a nozzle 220 used to spray a cleaning fluid 230 to clean a wafer backside 201, wherein the nozzle 220 is located on the wafer backside 201 of a wafer 200; and a positive voltage end 251 and a negative voltage end 252, wherein the positive voltage end 251 and the negative voltage end 252 are located on the wafer backside 201 and respectively located on both sides of the nozzle 220, and are used to apply an electric field to the cleaning fluid 230 sprayed by the nozzle 220, so that an included angle between the cleaning fluid 230 and the wafer backside 201 is controllable when the nozzle 220 starts to spray the cleaning fluid 230.

As stated above, the positive voltage end and the negative voltage end are provided on both sides of the nozzle to apply an electric field to the cleaning fluid sprayed by the nozzle, and the electric field guides the cleaning fluid to form the included angle θ between the cleaning fluid and the wafer backside, such that spraying of the cleaning fluid does not always start from the center of the wafer backside, avoiding the problem that the center of the wafer backside is relatively thin while the edge thereof is relatively thick after a plurality of repeated wet cleaning processes, and thereby improving the yield of semiconductor devices.

Figure 3:
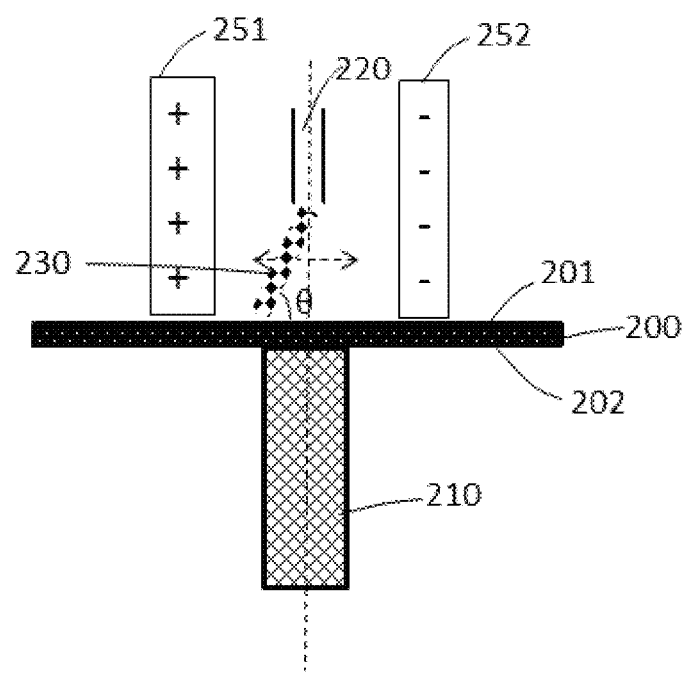
FIG. 3 is a schematic diagram of a cleaning fluid guide device for wet cleaning equipment according to an embodiment of the present disclosure.

In an embodiment, referring to FIG. 3, the nozzle 220 is located at the center of the wafer backside 201, and the cleaning fluid 230 sprayed by the nozzle 220 is guided by the electric field formed by the positive voltage end 251 and the negative voltage end 252 located on both sides of the nozzle 220, so that the included angle θ between the cleaning fluid 230 and the wafer backside 201 is controllable. When the included angle θ is equal to 90 degrees, the spraying of the cleaning fluid 230 starts from the center of the wafer backside 201; and when the included angle θ is not equal to 90 degrees, the spraying of the cleaning fluid 230 starts from a position deviate from the center of the wafer backside 201. In addition, the intensity of the electric field can be controlled by controlling the magnitude of a voltage between the positive voltage end 251 and the negative voltage end 252, so that the magnitude of the included angle θ can be controlled, thereby controlling the distance of the cleaning fluid 230 deviating from the center of the wafer backside 201. In this way, the spraying of the cleaning fluid always starting from the same position on the wafer backside in a plurality of wet cleaning processes is avoided, avoiding the problem that a part of the wafer backside is relatively thin while other part thereof is relatively thick, and thereby improving the yield of semiconductor devices.

In an embodiment, the electric field formed by the positive voltage end 251 and the negative voltage end 252 is an electrostatic field.

In an embodiment, referring to FIG. 3, the wafer 200 is supported by a support portion 210, and the support portion 210 is located on the other side 202 of the wafer opposite to the wafer backside 201.

Figure 4:
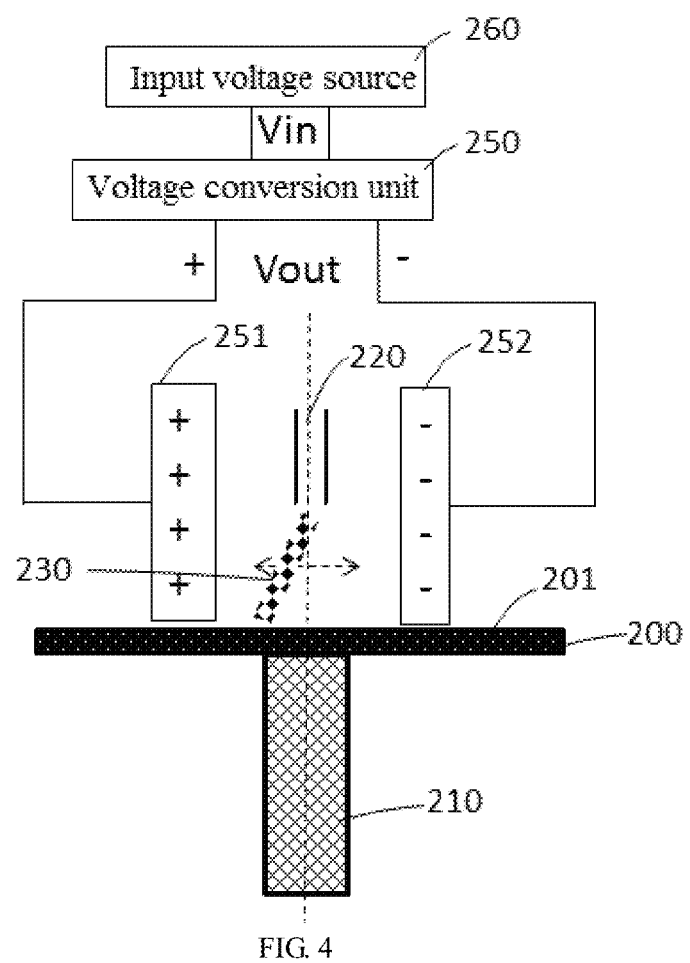
FIG. 4 is a schematic diagram of a cleaning fluid guide device for wet cleaning equipment according to another embodiment of the present disclosure.

Please refer to FIG. 4, which is a schematic diagram of the cleaning fluid guide device for wet cleaning equipment according to another embodiment of the present disclosure. Referring to FIG. 4, the cleaning fluid guide device for wet cleaning equipment further includes: a voltage conversion unit 250 having an input end connected to an input voltage source 260 for receiving an input voltage Vin, a positive output end connected to the positive voltage end 251, and a negative output end connected to the negative voltage end 252, so as to convert the input voltage Vin into an output voltage Vout and apply the output voltage Vout between the positive voltage end 251 and the negative voltage end 252.

More specifically, in an embodiment, the input voltage source 260 and the voltage conversion unit 250 are voltage source and voltage conversion unit built in a wet cleaning machine, or are external voltage source and voltage conversion unit.

More specifically, in an embodiment, the output voltage Vout of the voltage conversion unit 250 includes a plurality of pulse voltages, each of the pulse voltages has a high level and a low level, and the pulse voltage is at the high level when the nozzle 220 starts to spray the cleaning fluid 230 and switches to the low level after the nozzle 220 sprays the cleaning fluid 230. Specifically, referring to FIG. 5, which is a schematic diagram of a waveform of the output voltage of the voltage conversion unit according to an embodiment of the present disclosure, in a wet cleaning process, at a time when the nozzle 220 sprays the cleaning fluid 230 to start the wafer backside cleaning process, such as time t1, the voltage conversion unit 250 outputs a high-level first voltage V1 so that when the nozzle 220 starts to spray the cleaning fluid 230, an electric field formed by the first voltage V1 lead to the formation of a first included angle θ1 between the cleaning fluid 230 and the wafer backside 201; at a time after a first time period, such as time t2, the output voltage of the voltage conversion unit 250 switches to a low level, such as 0V, so that a 90-degree included angle is formed between the cleaning fluid 230 and the wafer backside 201, and at the same time, the wafer rotates about the center thereof to clean the entire wafer backside; and in this case, only when the nozzle 220 starts to spray the cleaning fluid 230, does the pulse voltage output by the voltage conversion unit 250 form an electric field so that an included angle not equal to 90 degrees is formed between the cleaning fluid 230 and the wafer backside 201. In another wet cleaning process, at a time when the nozzle 220 sprays the cleaning fluid 230 to start the wafer backside cleaning process, such as time t3, the voltage conversion unit 250 outputs a high-level second voltage V2 so that when the nozzle 220 sprays the cleaning fluid 230, an electric field formed by the second voltage V2 lead to the formation of a second included angle θ2 between the cleaning fluid 230 and the wafer backside 201; at a time after a second time period, such as time t4, the output voltage of the voltage conversion unit 250 switches to a low level, such as 0V, so that a 90-degree included angle is formed between the cleaning fluid 230 and the wafer backside 201, and at the same time, the wafer rotates about the center thereof to clean the entire wafer backside; and in this case, only when the nozzle 220 starts to spray the cleaning fluid 230, does the pulse voltage output by the voltage conversion unit 250 apply an electric field to the cleaning fluid 230 so that an included angle not equal to 90 degrees is formed between the cleaning fluid 230 and the wafer backside 201. Different pulse voltages are controlled to have different high-level voltage values, such as the value of the first voltage V1 and the value of the second voltage V2, so that in different cleaning processes, included angles formed between the cleaning fluid 230 and the wafer backside 201 are different at the start of the cleaning, thereby avoiding the spraying of the cleaning fluid always starting from the same position on the wafer backside in a plurality of wet cleaning processes.

Figure 5:
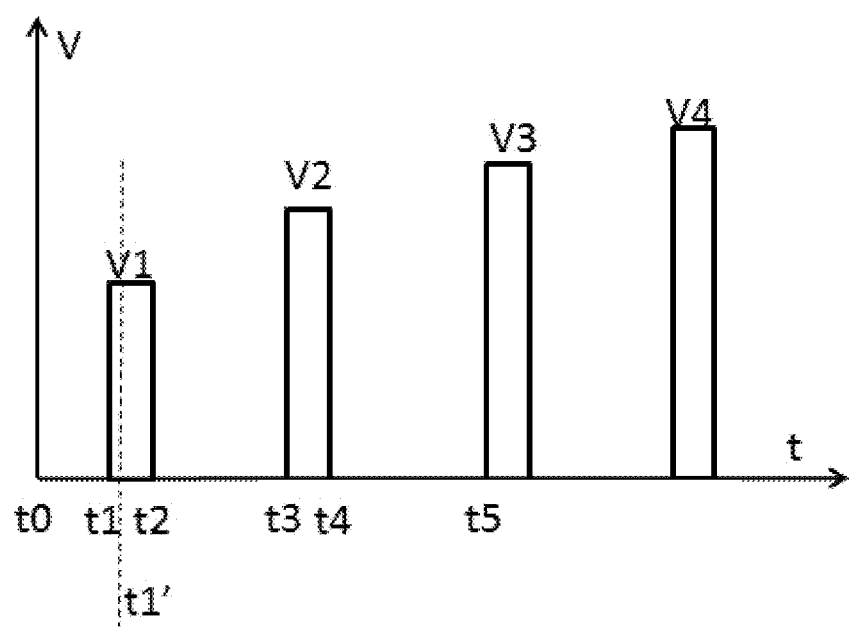
FIG. 5 is a schematic diagram of a waveform of an output voltage of a voltage conversion unit according to an embodiment of the present disclosure.

More specifically, in an embodiment, the pulse voltage output by the voltage conversion unit 250 is at a high level before the nozzle 220 starts to spray the cleaning fluid 230 and switches to a low level after the nozzle 220 sprays the cleaning fluid 230, so that an electric field is formed before the wet cleaning process starts, thereby avoiding a situation in which no electric field is formed to guide the cleaning fluid 230 when the nozzle 220 sprays the cleaning fluid 230. Referring to FIG. 5, at time t1, the voltage conversion unit 250 outputs the high level of the pulse voltage, and at time t1' after t1, the nozzle 220 starts to spray the cleaning fluid 230.

In an embodiment, the pulse voltage is a transient pulse voltage, and is required only to apply an electric field to the cleaning fluid when or before the nozzle 220 starts to spray the cleaning fluid; and after the nozzle 220 sprays the cleaning fluid 230, the cleaning process can be performed in an original cleaning mode of the cleaning equipment.

In this way, when or before the nozzle starts to spray the cleaning fluid, an electric field formed by the high level of the pulse voltage can implement short-time slight deviation of the cleaning fluid, and high levels with different intensities generate different electric fields such that degrees of the short-time slight deviation of the cleaning fluid are different, thereby changing the positions from which spraying of the cleaning fluid starts in different cleaning processes, and effectively avoiding the spraying of the cleaning fluid always starting from the same position on the wafer backside in a plurality of wet cleaning processes. In addition, no mechanical component is required in the present application, thereby effectively reducing component wear caused by moving a mechanical arm to change the position in the prior art, and avoiding a resulting particle defect.

More specifically, the voltage conversion unit 250 includes a switch unit, and a high-level value and high-level duration of the pulse voltage are controlled by controlling a duty cycle of the switch unit. The intensity of the electric field applied to the cleaning fluid 230 sprayed by the nozzle 220 is controlled by controlling the high-level value of the pulse voltage, thereby controlling the magnitude of the included angle between the cleaning fluid 230 and the wafer backside 201, that is, the included angle between the cleaning fluid 230 and the wafer backside 201 is controllable. Furthermore, the duration of the high level of the pulse voltage, such as duration between t1 and t2, is controlled to control duration of the application of the electric field, thereby controlling duration of the cleaning fluid sprayed by the nozzle deviating from the center of the wafer backside.

Finally, it should be noted that the above embodiments are used only for illustration of the technical solutions of the present application, but not for limitation. Although the present application has been described in detail with reference to the foregoing embodiments, those skilled in the art should understand that, they can still modify the technical solutions described in the foregoing embodiments, or make equivalent replacement for some or all of the technical features therein; and these modifications or replacements do not cause the essence of the corresponding technical solutions to deviate from the scope of the technical solutions in the embodiments of the present application.

What is claimed is:

1. A cleaning fluid guide device for wet cleaning equipment, comprising:
   a nozzle used to spray a cleaning fluid to clean a wafer backside, wherein the nozzle is located on the wafer backside of a wafer; and
   a positive voltage end and a negative voltage end, wherein the positive voltage end and the negative voltage end are located on the wafer backside and respectively located on both sides of the nozzle, and are used to apply an electric field to the cleaning fluid sprayed by the nozzle, so that an included angle between the cleaning fluid and the wafer backside is controllable when the nozzle starts to spray the cleaning fluid.

2. The cleaning fluid guide device for wet cleaning equipment according to claim 1, wherein the nozzle is located at the center of the wafer backside.

3. The cleaning fluid guide device for wet cleaning equipment according to claim 1, wherein the electric field formed by the positive voltage end and the negative voltage end is an electrostatic field.

4. The cleaning fluid guide device for wet cleaning equipment according to claim 1, further comprising a voltage conversion unit having an input end connected to an input voltage source for receiving an input voltage, a positive output end connected to the positive voltage end, and a negative output end connected to the negative voltage end, so as to convert the input voltage into an output voltage and apply the output voltage between the positive voltage end and the negative voltage end.

5. The cleaning fluid guide device for wet cleaning equipment according to claim 4, wherein the output voltage comprises a plurality of pulse voltages, each of the pulse voltages has a high level and a low level, and the pulse voltage is at the high level when the nozzle starts to spray the cleaning fluid and switches to the low level after the nozzle sprays the cleaning fluid.

6. The cleaning fluid guide device for wet cleaning equipment according to claim 4, wherein the output voltage comprises a plurality of pulse voltages, each of the pulse voltages has a high level and a low level, and the pulse voltage is at the high level before the nozzle starts to spray the cleaning fluid and switches to the low level after the nozzle sprays the cleaning fluid.

7. The cleaning fluid guide device for wet cleaning equipment according to claim 5, wherein different pulse voltages have different high-level voltage values.

8. The cleaning fluid guide device for wet cleaning equipment according to claim 6, wherein different pulse voltages have different high-level voltage values.

9. The cleaning fluid guide device for wet cleaning equipment according to claim 5, wherein the pulse voltage is a transient pulse voltage.

10. The cleaning fluid guide device for wet cleaning equipment according to claim 6, wherein the pulse voltage is a transient pulse voltage.

11. The cleaning fluid guide device for wet cleaning equipment according to claim 5, wherein the voltage conversion unit comprises a switch unit, and a high-level value and high-level duration of the pulse voltage are controlled by controlling a duty cycle of the switch unit.

12. The cleaning fluid guide device for wet cleaning equipment according to claim 6, wherein the voltage conversion unit comprises a switch unit, and a high-level value and high-level duration of the pulse voltage are controlled by controlling a duty cycle of the switch unit.

13. The cleaning fluid guide device for wet cleaning equipment according to claim 1, wherein an input voltage source and a voltage conversion unit are voltage source and voltage conversion unit built in a wet cleaning machine.

\* \* \* \* \*